(12) United States Patent
Gerdes et al.

(10) Patent No.: US 6,510,617 B1
(45) Date of Patent: Jan. 28, 2003

(54) BELT ELONGATION MEASUREMENT DEVICE

(75) Inventors: Brent James Gerdes, Lincoln, NE (US); James Walter Debus, Lincoln, NE (US)

(73) Assignee: The Goodyear Tire & Rubber Company, Akron, OH (US)

( * ) Notice: Subject to any disclaimer, the term of this patent is extended or adjusted under 35 U.S.C. 154(b) by 0 days.

(21) Appl. No.: 09/744,735
(22) PCT Filed: Aug. 26, 1998
(86) PCT No.: PCT/US98/17655
§ 371 (c)(1),
(2), (4) Date: Jan. 24, 2001
(87) PCT Pub. No.: WO00/12955
PCT Pub. Date: Mar. 9, 2000

(51) Int. Cl.⁷ .......................... G01B 11/02; H03M 1/22
(52) U.S. Cl. .......................... 33/484; 33/707; 33/555.4; 33/679.1
(58) Field of Search .......................... 33/484, 707, 706, 33/1 D, 485, 486, 488, 494, 712, 600, 679.1, 555.1, 555.4, 783, 810–813, 830, DIG. 13; 356/615, 616, 618

(56) References Cited

U.S. PATENT DOCUMENTS

| | | | | |
|---|---|---|---|---|
| 2,428,980 A | * | 10/1947 | McCann | 33/514.2 |
| 4,037,325 A | * | 7/1977 | Weber et al. | 33/707 |
| 4,472,883 A | | 9/1984 | Ortega | 33/518 |
| 4,920,659 A | * | 5/1990 | Becher | 33/555.4 |
| 5,732,475 A | | 3/1998 | Sacks et al. | 33/555.4 |
| 5,778,542 A | * | 7/1998 | Spoto | 33/707 |
| 5,889,280 A | * | 3/1999 | Matsuura | 33/707 |

\* cited by examiner

Primary Examiner—Diego Gutierrez
Assistant Examiner—Stanley J. Pruchnic, Jr.
(74) Attorney, Agent, or Firm—Nancy T. Krawczyk

(57) ABSTRACT

A device (10) for determining the movement or elongation of an article, particularly a belt (28), is disclosed. The device (10) is comprised of two different pitched length scales (12, 14) which when laid upon one another form a vernier scale. When the scales are laid upon one another, a small area of visible contrasting color (24) is seen. A large movement of the visible contrasting color (24) indicates the miniscule movement of either scale (12, 14), relative to the other. The device (10) disclosed may also be partially imprinted onto a belt (28) wherein minute elongation of the belt (28) is obvious.

17 Claims, 5 Drawing Sheets

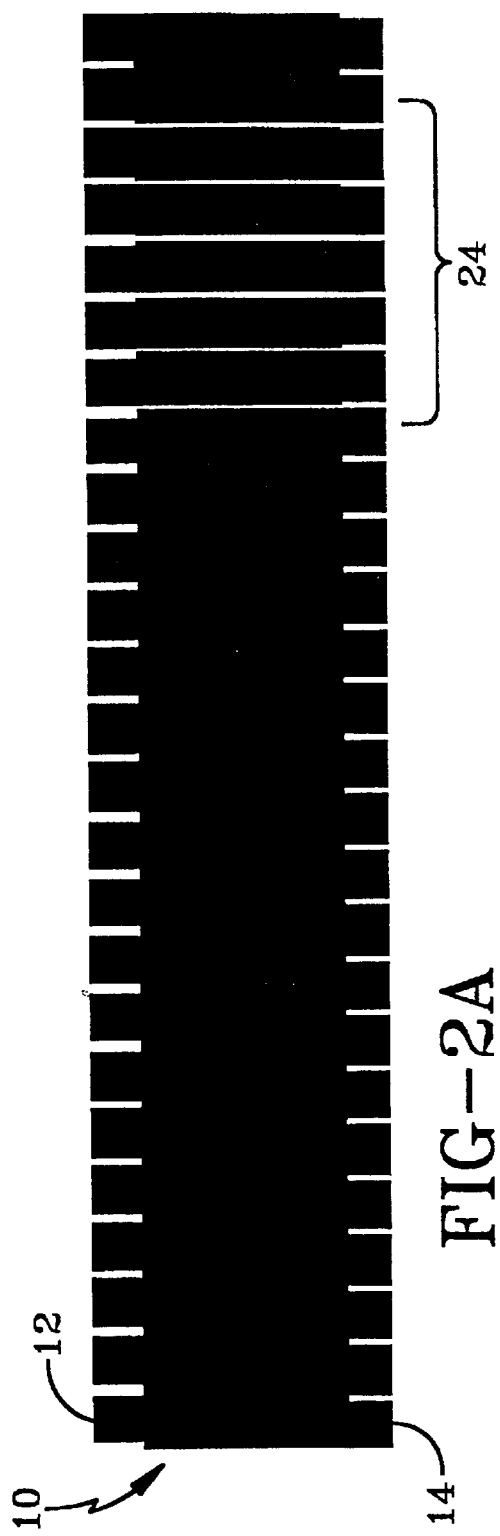

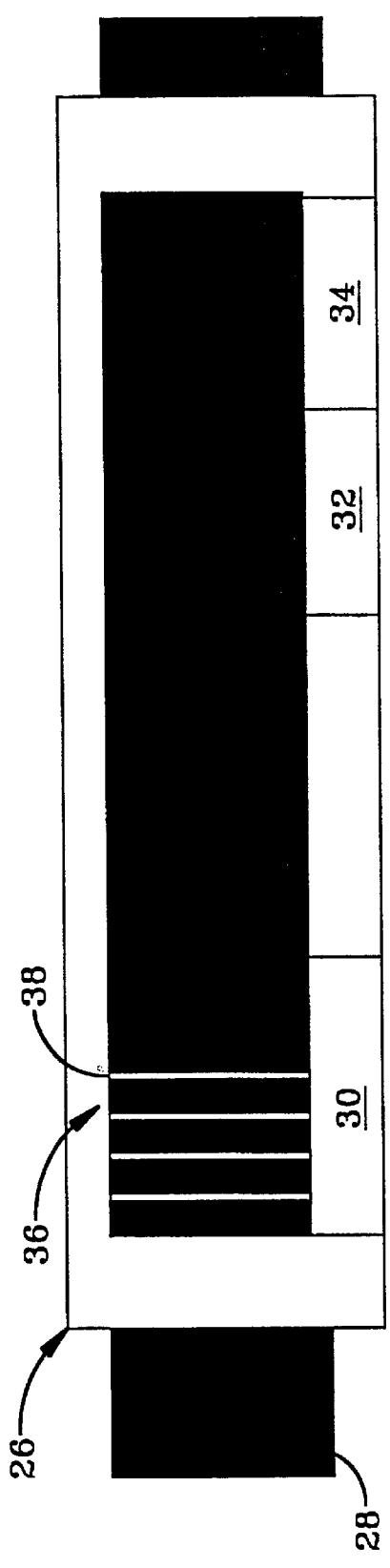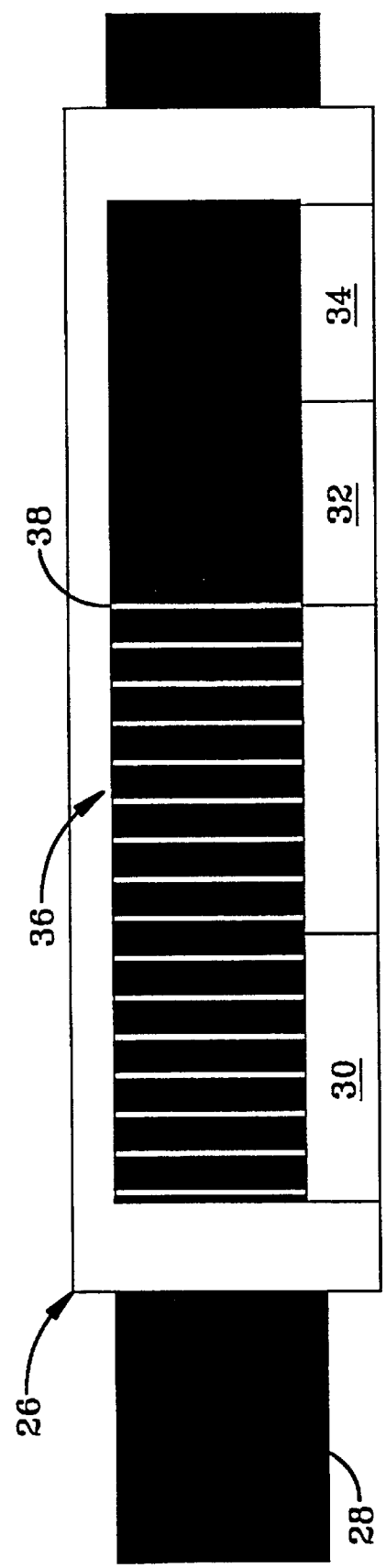

BELT ELONGATION MEASUREMENT DEVICE

FIELD OF THE INVENTION

The disclosed invention is directed toward a device and a method for visually determining the relative elongation of a flexible member in tension or compression. The invention is applicable for setting the correct tension level in belts, preferably transmission belts. The disclosed device can be employed as either an integral part of the belting or a separate device for use with the belting.

BACKGROUND OF THE INVENTION

When mounting a belt, or any other endless flexible article, between a leading member and a driven member, strict observation of the belt tension is required to permit full effectiveness while ensuring an optimal belt life. If the belt is too loose, it will slip and generate noise. If the belt is too tight, belt durability decreases and the associated members about which the belt travels are subjected to excessive stress. This is true for almost every type of belt in the automotive and manufacturing industries. Belts are normally adjusted, checked for tension, readjusted and rechecked until the proper belt tension is achieved.

Measuring belt tension has often been very difficult and time consuming. One known method of checking the mounting tension of a transmission belt requires special tooling which implies a delicate long procedure being needed to implement the belt. U.S. Pat. No. 4,860,597 discloses one such exemplary device.

Another method of correctly tensioning belts employs the measurement of the natural frequency of a vibrating span of the belt. The frequency of the vibrating belt span changes with tension. Expensive equipment is used to measure the change and the tension is subsequently calculated. Such known devices cost more than $1,000, proving to be a costly investment for those that need to purchase belt tension testers.

U.S. Pat. No. 5,391,120 discloses an elongation method for proper tensioning of a transmission belt. The belt is marked with two lines and a spacing requirement between the two lines. After installing the belt, the belt is elongated until the required spacing is met. After each adjustment to the belt tension, the separate measuring device is used to determine the spacing between the lines. This procedure of adjusting, stopping and measuring is repeated until the stated distance is achieved.

Other known methods include a deflection method whereby a known force is applied perpendicular to the center of a belt span and the belt deflected a certain distance.

Other non-belt-type application employ vernier scales for determining proper alignment. U.S. Pat. No. 5,385,289 discloses the use of vernier scales for alignment of a PC board and a solder stencil. The PC board has a set of etch blocks with a larger central block for denoting proper alignment when visible in the central opening of the solder stencil.

U.S. Pat. No. 4,185,908 discloses the use of a vernier belt tensioning system for a document feeder of a photocopy machine. Two sets of pitched vernier holes enable an accurate setting of the parallelness of the belt pulleys for the document feeder. When a set of holes are aligned in one set of plates for a first pulley, a pin is insert in the aligned holes. The corresponding set of plates for the second pulley is then adjusted until the same holes are aligned and a pin is inserted. The two sets of vernier scales enable the front and the back frames of the pulleys to be correctly aligned.

All of the aforementioned methods are either much more expensive than the disclosed invention or are much more cumbersome and time consuming. The disclosed invention provides a quick visual method of determining when the proper belt tension is reached. The disclosed invention also provides a "hands-free" method of determining if proper belt tensioning has been achieved.

SUMMARY OF THE INVENTION

The present invention is directed toward a visual method of determining the relative elongation of a flexible member, when the member is in either tension or compression.

Another aspect of the present invention is to provide a simple and inexpensive means of measuring static strand tension in a member under tension or compression.

The present invention is achieved by an elongation measuring device affixed to belting that uses a visible vernier scale that greatly magnifies a small amount of elongation. The vernier scale is calibrated to correspond with the correct installation tension provided by the belt manufacturer.

The present method accomplishes measuring of the tension of a belt by attaching the device to the belt before tensioning of the belt, and watching for alignment of the scale until proper tension is achieved.

BRIEF DESCRIPTION OF THE DRAWINGS

The invention will be described by way of example and with reference to the accompanying drawings in which:

FIGS. 2a–2c are illustrative of the device of FIG. 1 when used to measure relative elongation;

FIGS. 4a–4b are illustrative of the device of FIG. 3 when used to measure relative elongation.

DETAILED DESCRIPTION OF THE PREFERRED EMBODIMENTS

Figure 1:
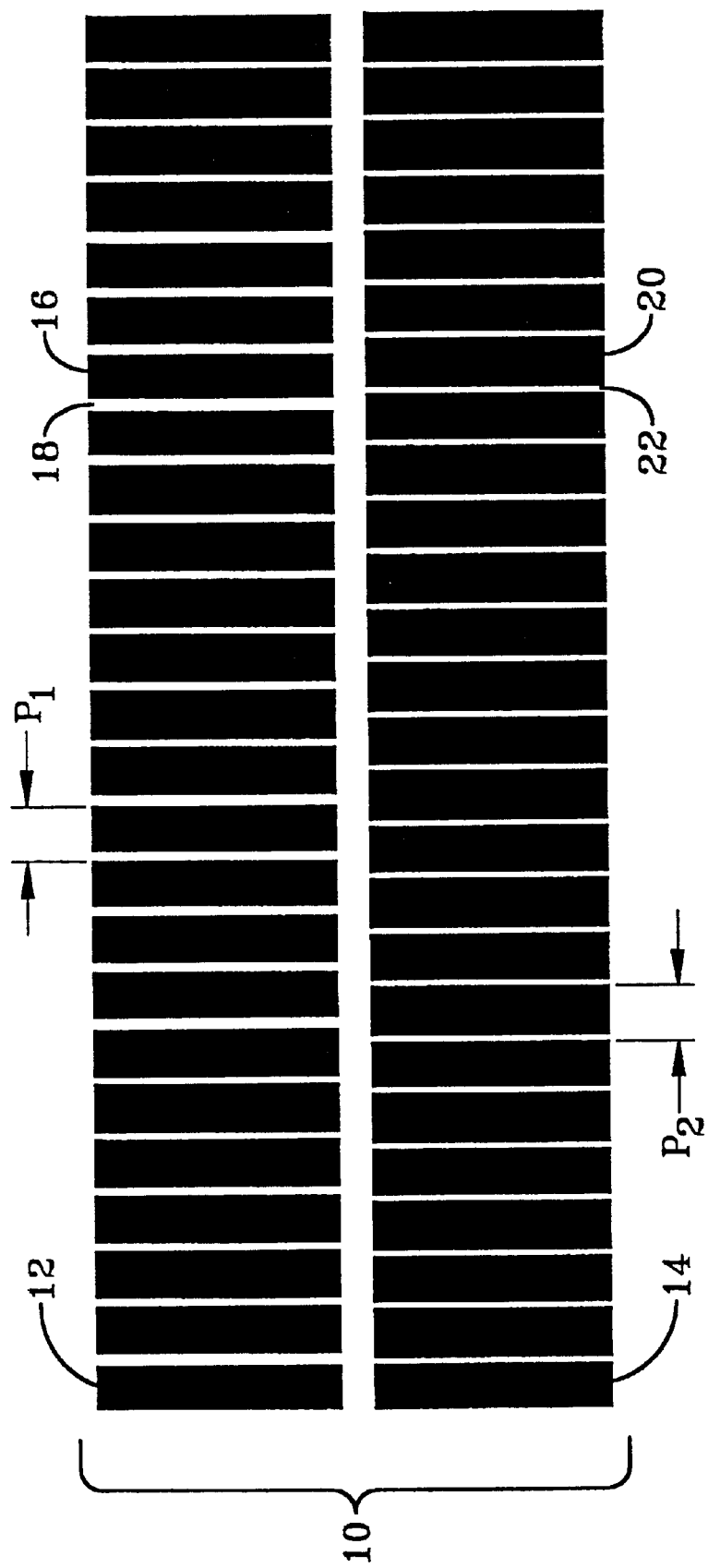
FIG. 1 is illustrative of the inventive two-piece device.

FIG. 1 is a simplified illustration of the inventive elongation measuring device 10. The elongation measuring device is a set of graduated scales 12, 14. The scales 12, 14 in combination creating a vernier scale. Each scale 12, 14 is comprised of a series of pitched segments. Each segment consists of a bar 16, 20 and a space 18, 22. The first scale 12 has a smaller number of segments than the second scale 14 though the lengths of the two scales are equivalent. Varied pitch lengths for the segments achieve the difference in the number of segments. The pitch length of the first scale $P_1$ is greater than the pitch length of the second scale $P_2$. The device, that is, the vernier scale, is calibrated to correspond with the correct elongation of the item to be measured.

For measuring the relative elongation of a stretchable member, whether in tension or compression, the two scales are overlaid one on top of the other. The first scale 12 is on a transparent carrier so the spaces 18 are transparent. The transparency of the spaces 18 is accomplished by rendering the bars 16 a dark color such as black or brown. The transparent carrier upon which the scale is affixed may be a single transparent film strip which is directly used with the second scale 14, or the strip may be placed inside of a transparent sleeve, within which the scale 12 is free to slide.

When a transparent sleeve is used, the second scale 14 may be placed also within the sleeve in a manner permitting sliding of the second scale 14, relative to the sleeve and the first scale 12. The edges of such a sleeve, or even the film may be provided with any type of printed matter, such as an indicator for when the proper tension is achieved. Such marking is permissible so long as there remains a central window by which the scales 12, 14 are visible to the operator.

The spaces 22 of the second scale 14 are of a color contrasting with the fixed color of the bars 16, 20 of both scales. For the greatest contrast, the color can be of a highly visible color, for example yellow, red, and bright neon colors. The contrasting bars 20 can be black or brown. A highly visible contrasting color selection renders the relative elongation of the belt obvious to the user as the scales slide relative to each other in the manner illustrated in FIGS. 2A through 2C.

FIG. 2A is illustrative of an initial alignment registered by the elongation device 10. The second scale 14 with the visible spaces 22 is located under the first scale 12 with the transparent spaces 18. The pitch length difference of the two scales 12, 14 result in a contrasting area 24 of the transparent spaces 18 and visible spaces 22 at one location of the device 10. The contrasting area 24 visibly indicates the position of the scales 12, 14 relative to each other and the relative movement of the scales.

As the first scale 12 is moved with respect to the second scale 14, either by movement of the just one of the scales 12, 14 or the opposing movement of both scales 12, 14, the position of the contrasting area 24 also moves, as illustrated in FIG. 2B. The relative movement of the scales is minimal, less than the pitch length P1, P2 of either scale 12, 14. However, the large movement of the contrasting area 24 dramatically visualizes the miniscule movement of the scales 12, 14. This large movement of the contrasting area 24 is determined by the selection of the differing pitch lengths of the two scales 12, 14.

Figure 2C:
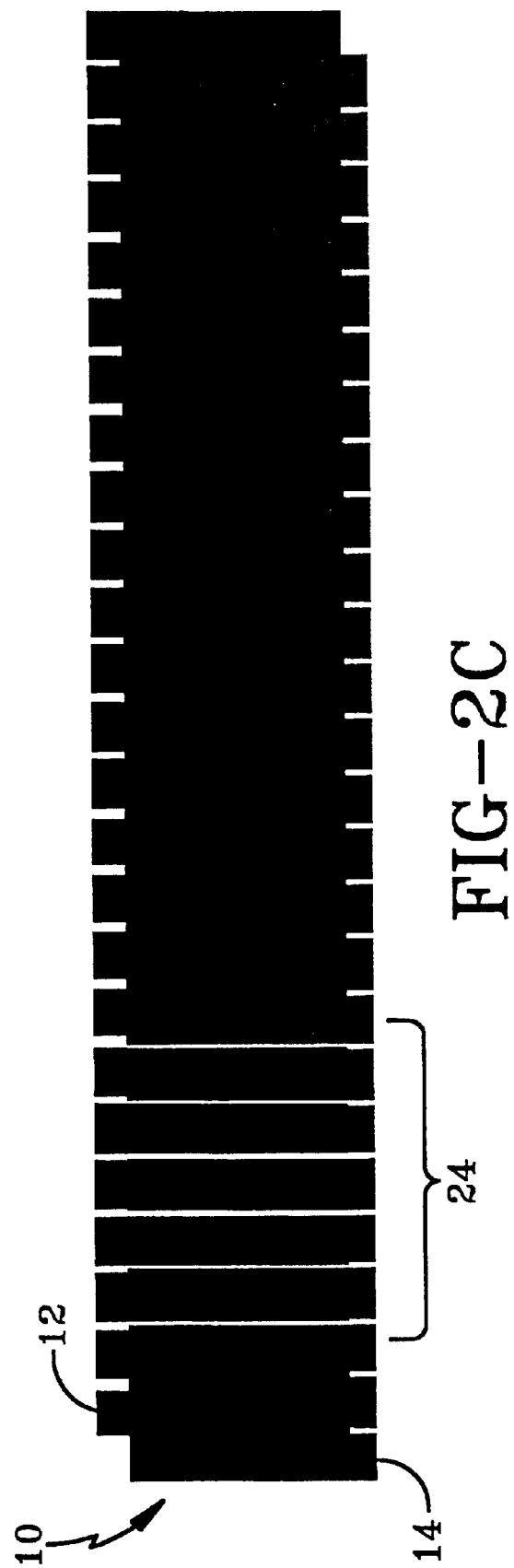

As the relative scale movement is equal to a pitch length, the contrasting area 24 approaches the end of the scale, as illustrated in FIG. 2C, the contrasting area traveling the full distance of the scale. FIGS. 2A through 2C illustrate the visible vernier scale 10 as it magnifies a small amount of movement. In FIGS. 2A through 2C, the scales 12, 14 are shown in a vertically offset position for illustrating the relative horizontal movement between the two scales 12, 14.

While the above description pertains solely to the movement of the scales, the device 10 operates in an identical fashion when mounted on a flexible member. The flexible member may be any article that is capable of being in either compression or elongation. The member may be an endless belt, such as a transmission belt, agricultural belt, or conveyor belt. The member may also be a flexible element secured at its endpoints wherein the tension of the member is important to its operation or placement. Whether the flexible member is to be elongated or compressed, the scales 12, 14 measure the relative movement of the member.

For ease of description, the following methods of use of the measuring device 10 will be in combination with an endless belt, such as a transmission belt. The following descriptions are in no way limiting to the use of the device 10, although it has been determined that the inventive device is extremely useful in the particular measurement of the crucial proper tension of transmission belts.

When using the vernier scale elongation measuring device 10 with a belt, the second scale 14 is first placed on the belt, and attached at a first end of the scale 14 to the belt. The attachment may be done by a number of means. For example, by placing an adhesive patch, or similar tacky surface, on the underside of the scale 14 at the first end, or by forming a pair of clips at the first end of the scale which wrap around the belt and secure the scale 14. As disclosed previously, both scales 12, 14 may also be placed in a transparent sleeve so the scale 12, 14 remain in contact with each other, rendering the visual reading easier.

After the second scale 14 is attached to the belt, the first scale 12 is placed over the second scale 14 so the first scale 12 covers at least a portion of the second end of the second scale 14, as illustrated in FIGS. 2A–2C. The end of the first scale 12, which does not overlap the second scale 14, is secured to the belt in a manner similar to the second scale 14.

As the belt is elongated, the secured ends of the scales 12, 14 move with the belt permitting the scales 12, 14 to slide, relative to each other, in opposing directions. As the scales 12, 14 slide in opposing directions, the overlapping area 24 visually magnifies the elongation of the belt. The belt is elongated until the contrasting area 24 reaches the desired location along the length of the device 10. The required elongation of the belt, as indicated by the device 10, may be a combination of the number of visible spaces 22 of the second scale 14 visible to the left of the device and the location of the contrasting area 24. The number of visible spaces 22 is dependent upon several factors, including the initial tension of the belt when placed upon the support members and the initial amount of overlap of the two scales 12, 14 when the device 10 is placed on the belt.

For ease of use of the device, either the film upon which either scale is affixed or the sleeve into which either sleeve may be inserted, may be provided with outer regions wherein areas are marked to indicate where the visible spaces 22 should be to achieve the correct tensioning of the belt, similar to the areas 32 and 34 discussed or the multiple areas discussed below. The device, comprising the vernier scale, is calibrated to correspond with the correct installation tension provided by the belt manufacturer.

If the required elongation of the belt to achieve proper tensioning is miniscule, then the device 10 movement is also miniscule, as illustrated in FIGS. 2A to 2C. However, the movement of the visible contrasting area region 24 greatly magnifies the miniscule movement. The operator who is tensioning the belt is able to tighten the belt while watching the device 10 to determine when the proper tension is reached. Thus the operator performs a non-stop, two step process of tighten and watch, as opposed to the repeated three step process of tighten, stop, and measure.

Figure 3:
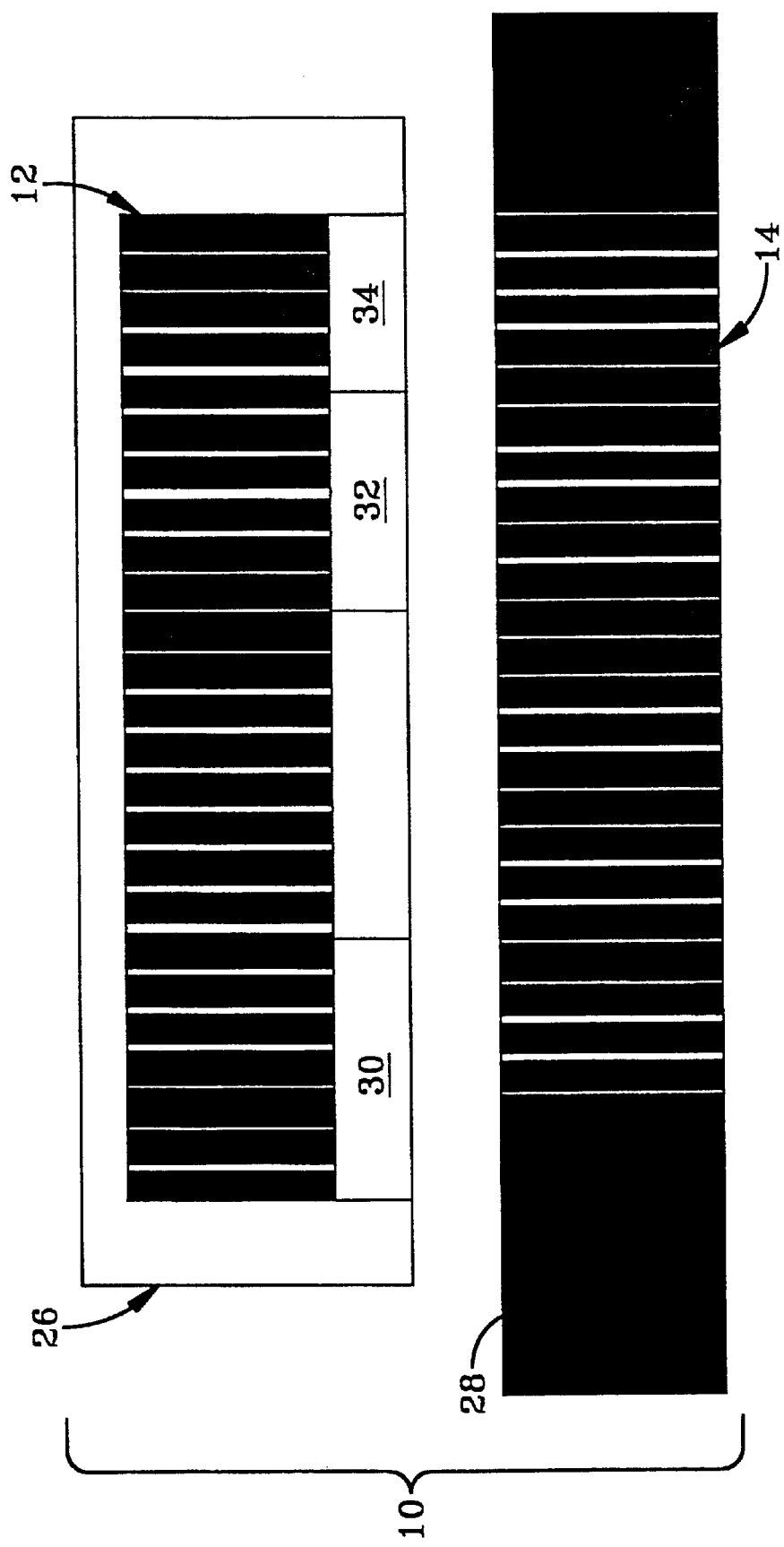
FIG. 3 is illustrative of the inventive device when it is part of the member being measured.

As illustrated in FIG. 3, the device 10 may also be a partially integrated into the belt 28. The device 10 consists of the first scale 12 mounted within a reader 26. The first scale 12 is substantially identical to that illustrated in FIG. 1 wherein the spaces 18 between the bars 16 are transparent. At one end of the reader 26, below the scale 12, is an area 30 which assists the operator in the initial placement of the reader upon the belt. The second 32 and third 34 areas under the scale 12 are for indicating when proper tension of the belt has been achieved. These features are further described in conjunction with FIGS. 4A and 4B.

The second scale 14 is an integral part of the belt 28. If the belt 28 has a dark background, as illustrated, then the only required indicia is the visible colored spaces 22. As discussed above, the spaces 22 should be formed of a contrasting color, so conversely, if the belt background is light colored, the visible spaces 22 should be formed of a color that contrasts with the bars 16 of the first scale 12. The visible colored spaces 22 may extend to the edges of the belt and may be placed in a repeating manner about the length of the belt. At a minimum there must at least one set of visible-colored spaces 22 on the belt. Multiple sets placed at intervals about the outer circumference of the belt assist the operator who is installing and tensioning the belt 28, as he need not be concerned about the exact placement of the belt 28 about the support members so long as at least one full set of spaces 22 is visible and accessible for placement of the reader 26 on top of the belt 28.

FIGS. 4A and 4B illustrate the elongation measurement of the belt. The reader 26 is placed over the visible colored spaces 22 of the belt 28. By adjusting the pitch length of the scales 12, 14, the majority of the visible colored spaces 22 of the second scale 14 are blacked out and only a small window 36 of visible colored spaces 22 appears through the transparent spaces 18 of the first scale. The reader is positioned so the window of color 36 and the leading edge 38 of the visible color are within the start area 30. The area 30 may be marked with the appropriate indicia such as "Start" or "Initial Tension."

As illustrated in FIG. 4B, as the belt 28 and scale 14 are elongated the window of color 36 increases along the reader 26. That is, as the belt is elongated, alignment of the transparent spaces 18 of the first scale 12 and the colored spaces 22 of the second scale 14 occurs along the length of the reader 26. Elongation to a larger degree results in greater alignment, varying from the initial alignment percentage to a complete 100% alignment along the reader 26. The leading edge 38 is indicative of the elongation of the belt.

Along the lower edge of the reader 26, areas 32 and 34 may be marked to indicate different tension levels. For different tension levels, there may be multiple areas along the either edge of the reader. For multiple areas, the areas may simply be numbered alpha numerically wherein the operator could look up in a manual the required tension level, corresponding to one of the alpha numerical areas, for the particular belt.

For the illustrated belt, the first area 32 may be marked "Used" and the second area 34 may be marked "New." For a belt so marked, when the leading edge 38 of the window 36 in the area 32 marked "Used," proper tension for a used belt has been achieved. Similarly, for a new belt when the leading edge 38 has reached the area 34 marked "New" the proper tension is achieved. To achieve the leading edge 38 being located in the required area, either in area 32 or 34, or one of a multiple alpha numerically indicated areas, the device is calibrated for the proper tension of the belt. This is achieved by a determining the pitch length for the scales 12, 14 that will indicate the desired elongation.

The above described invention provides a quick visual method of determining when the proper belt tension is reached, whether by the use of the device 10 as a two piece elongation measurement device or when the invention is integral with the belt, as marked indicia on the belt surface.

The embodiments of the invention described above should be considered as illustrative and not as limiting the scope of the invention as defined in the following claims.

What is claimed is:

1. A device (10) for determining the movement of a first member relative to a second member, the device (10) having a defined length and comprising two scales (12, 14), the first scale (12) being attached to a first member, the scale (12) comprising a set of transparent marks (18), the marks (18) being spaced at a first pitch length ($P_1$), the second scale (14) being attached to a second member, the second scale (14) comprising a set of marks (22), the marks (22) being spaced at a second pitch length ($P_2$), the first and second pitch lengths ($P_1$, $P_2$) differing, the device (10) being characterized by:

the marks (22) of the second scale (14) being formed in a visible color, and the pitch lengths ($P_1$, $P_2$) differing to create an area of contrast (24) when the first scale (12) is placed over the second scale (14), the area of contrast (24) being capable of traveling along the length of the device (10) for each linear pitch length ($P_1$ or $P_2$) movement of one of the members relative to the other member.

2. A device (10) as set forth in claim 1 wherein the pitch lengths ($P_1$, $P_2$) of the scales (12, 14) are selected so that movement of the area of contrast (24) corresponds to a predetermined movement length of the one of the members relative to the other member.

3. A device (10) as set forth in claim 1 wherein the first member is a transparent film or sheet.

4. A device (10) as set forth in claim 1 wherein the second member is a transparent film or sheet.

5. A device (10) as set forth in claim 1 wherein the first scale (12) is printed onto the first member.

6. A device (10) as set forth in claim 1 wherein the second scale (14) is printed onto the second member.

7. A device (10) as set forth in claim 6 wherein the second member is a belt.

8. A device (10) as set forth in claim 1 wherein the area of contrast (24) is initially visible in only a limited portion of the overlapped members.

9. A device (10) as set forth in claim 8 wherein the limited area of visible contrast (24) travels the full length of the device (10) for each relative pitch length ($P_1$ or $P_2$) movement of the first and second members.

10. A device (10) as set forth in claim 8 wherein the area of visible contrast (24) increases as the first and second members move relative to one another.

11. A device (10) as set forth in claim 10 wherein the second member is a belt.

12. A device (10) for determining the relative elongation of a belt (28), the device (10) having a defined length and comprising two scales (12, 14), the first scale (12) being attached to a first member, the scale (12) comprising a set of transparent marks (18), the marks (18) being spaced at a first pitch length ($P_1$), the second scale (14) being attached to a surface of a belt (28), the second scale (14) comprising a set of marks (22), the marks (22) being spaced at a second pitch length ($P_2$), the first and second pitch lengths ($P_1$, $P_2$) differing, the device (10) being characterized by:

the marks (22) of the second scale (14) being formed in a visible color, and the pitch lengths ($P_1$, $P_2$) differing to create an area of contrast (24) which travels the length of the device (10) for each linear pitch length ($P_1$ or $P_2$) elongation of the belt when the first scale is placed over the second scale.

13. A device as set forth in claim 12 wherein the pitch lengths ($P_1$, $P_2$) of the scales (12, 14) are selected so that movement of the area of contrast (24) corresponds to a predetermined elongation of the belt (28).

14. A device (10) as set forth in claim 12 wherein the area of contrast (24) is initially visible in only a limited portion of the overlapped scales (12, 14).

15. A device (10) as set forth in claim 14 wherein the limited area of visible contrast (24) travels the full length of the device (10) for each pitch length ($P_1$ or $P_2$) elongation of the belt (28).

16. A device (10) as set forth in claim 14 wherein the area of visible contrast (24) increases as the belt (28) elongates.

17. A device (10) as set forth in either claim 12 or 16 wherein the second scale (14) is permanently affixed to the belt (28) in a manner permitting corresponding elongation of the scale (14) when the belt (28) elongates.

* * * * *